US007357017B2

(12) United States Patent
Felton et al.

(10) Patent No.: US 7,357,017 B2
(45) Date of Patent: Apr. 15, 2008

(54) WAFER LEVEL CAPPED SENSOR

(75) Inventors: Lawrence E. Felton, Hopkinton, MA (US); Kieran P. Harney, Andover, MA (US); Carl M. Roberts, Topsfield, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/836,205

(22) Filed: Aug. 9, 2007

(65) Prior Publication Data

US 2008/0009091 A1 Jan. 10, 2008

Related U.S. Application Data

(60) Division of application No. 11/088,270, filed on Mar. 23, 2005, now Pat. No. 7,275,424, which is a continuation-in-part of application No. 10/657,741, filed on Sep. 8, 2003, now abandoned.

(51) Int. Cl.
*G01N 19/02* (2006.01)
*H01N 23/14* (2006.01)

(52) U.S. Cl. .......................... 73/104; 73/488; 257/678; 257/704; 257/773; 29/595

(58) Field of Classification Search .................. 73/104, 73/488; 257/678, 704, 773, 774; 438/50
See application file for complete search history.

(56) References Cited

U.S. PATENT DOCUMENTS

| | | | | |
|---|---|---|---|---|
| 5,314,572 | A | 5/1994 | Core et al. | 156/643 |
| 5,326,726 | A | 7/1994 | Tsang et al. | 437/228 |
| 5,345,824 | A | 9/1994 | Sherman et al. | 73/517 |
| 5,417,111 | A | 5/1995 | Sherman et al. | 73/517 |
| 5,511,428 | A | 4/1996 | Goldberg et al. | 73/777 |
| 5,540,095 | A | 7/1996 | Sherman et al. | 73/514.18 |
| 5,610,431 | A | 3/1997 | Martin | 257/415 |
| 5,620,931 | A | 4/1997 | Tsang et al. | 438/50 |
| 5,872,496 | A | 2/1999 | Asada et al. | 335/78 |
| 6,153,839 | A | 11/2000 | Zavracky et al. | 200/181 |
| 6,307,169 | B1 | 10/2001 | Sun et al. | 200/181 |
| 6,384,353 | B1 | 5/2002 | Huang et al. | 200/181 |
| 6,429,511 | B2 | 8/2002 | Ruby et al. | 257/704 |
| 6,448,109 | B1 | 9/2002 | Karpman | 438/108 |
| 6,452,238 | B1 | 9/2002 | Orcutt et al. | 257/415 |
| 6,512,300 | B2 | 1/2003 | Cheever et al. | 257/777 |
| 6,559,530 | B2 | 5/2003 | Hinzel et al. | 257/684 |
| 6,630,725 | B1 | 10/2003 | Kuo et al. | 257/659 |
| 6,633,079 | B2 | 10/2003 | Cheever et al. | 257/723 |
| 6,743,656 | B2 | 6/2004 | Orcutt et al. | 438/66 |
| 6,753,208 | B1 | 6/2004 | MacIntyre | 438/118 |
| 2003/0038327 | A1 | 2/2003 | Smith | 257/415 |
| 2004/0077154 | A1 | 4/2004 | Nagarajan et al. | 438/455 |

OTHER PUBLICATIONS

Ando et al., *New Packaging Technology for SAW Device*, Corporate Components Development Center, Doc. No. WA1-3, 403-406, 4 pages.

(Continued)

*Primary Examiner*—Daniel S. Larkin
(74) *Attorney, Agent, or Firm*—Bromberg & Sunstein LLP

(57) ABSTRACT

A sensor has a die (with a working portion), a cap coupled with the die to at least partially cover the working portion, and a conductive pathway extending through the cap to the working portion. The pathway provides an electrical interface to the working portion.

7 Claims, 6 Drawing Sheets

OTHER PUBLICATIONS

Boustedt et al., *Flip Chip as an Enabler for MEMS Packaging*, 2002 Electronic Components and Technology Conference, Apr. 2002, 124-128, 5 pages.

Ok et al., *High Density, High Aspect Ratio Through-Wafer Electrical Interconnect Vias for MEMS Packaging*, 2003 IEEE Transactions on Advanced Packaging, vol. 26, No. 3, Doc. No. 1521-3323, Aug. 2003, 302-309, 8 pages.

Ok et al., *Generic, Direct-Chip-Attach MEMS Packaging Design with High Density and Aspect Ratio through-Wafer Electrical Interconnect*, 2002 Electronic Components and Technology Conference, Apr. 2002, 232-237, 6 pages.

Park et al., *A Novel-Low-Loss Wafer-Level Packaging of the RF-MEMS Devices*, 2002 IEEE, Doc. No. 0-7803-7185, Feb. 2002, 681-684, 4 pages.

Premachandran et al., *A Novel Electrically Conductive Wafer Through Hole Fille Vias Interconnect for 3D MEMS Packaging*, May 2003, 627-630, 4 pages.

Seeger et al., *Fabrication challenges for next-generation devices: Microelectromechanical systems for radio-frequency wireless communications*, 2003 Society of Photo-Optical Instrumentation Engineers, Jul. 2003,169-177, 9 pages.

ShellBGA, Online <www.shellcase.com/pages/products-shellbga.asp>, Dec. 2, 2002, 2 pages.

Teomim et al, *An innovative approach to wafer-level MEMS packaging*, Solid State Technology-semiconductor manufacturing and wafer fabrication, Dec. 2, 2002, 1-4, 4 pages.

Ziptronix White Paper, *MEMS: Mainstream Process Integration*, Ziptronix, 7 pages.

WAFER LEVEL CAPPED SENSOR

This patent application is a divisional application of U.S. patent application Ser. No. 11/088,270, filed Mar. 23, 2005, entitled, "WAFER LEVEL CAPPED SENSOR," which is a continuation-in-part application of U.S. patent application Ser. No. 10/657,741, filed Sep. 8, 2003 and now abandoned, entitled, "WAFER LEVEL CAPPED SENSOR," and naming Lawrence E. Felton, Kieran P. Hamey, and Carl M. Roberts as inventors, the disclosure of which is incorporated herein, in its entirety, by reference.

FIELD OF THE INVENTION

The invention generally relates to sensors and, more particularly, the invention relates to sensors having wafer level caps.

BACKGROUND OF THE INVENTION

Modern micromachining techniques have enabled designers to produce highly functional sensors in a minimum of space. For example, accelerometers have been widely produced as MEMS (microelectromechanical systems) to detect both positive and negative accelerations of an underlying system. One type of MEMS accelerometer converts the movement of a suspended mass into acceleration data.

To that end, the suspended mass typically has a plurality of movable fingers inter-digitated with a plurality of stationary fingers (on an underlying die) to form a variable capacitance. When subjected to an acceleration, the mass moves in an expected manner, thus changing the variable capacitance formed by the fingers. Detection circuitry detects this capacitance change and, consequently, converts it to a voltage or current signal that is proportional to the acceleration. Alternatively, the capacitance can be converted to a binary digital voltage or current signal that encodes the acceleration. Once determined, the acceleration data may be forwarded to another device, such as a computer, to perform some underlying function (e.g., deploy air bags).

The detection circuitry used to calculate acceleration can be either external or internal to the sensor. When external, the overall system has a number of problems. Among others, the interface between the sensor and interconnect circuitry (to the detection circuitry) can create a parasitic capacitance that can swamp the underlying signal being produced by the sensor. In other words, the variable capacitance produced by the inter-digitated fingers can be degraded by the parasitic capacitance produced by the sensor attach pads and circuitry. To overcome this problem, the sensor may be enlarged to produce a larger variable capacitance signal that can tolerate this parasitic capacitance. This solution, however, is contrary to one of the goals of MEMS devices—namely miniaturization.

SUMMARY OF THE INVENTION

In accordance with one aspect of the invention, a sensor has a die (with a working portion), a cap coupled with the die to at least partially cover the working portion, and a conductive pathway extending through the cap to the working portion. The pathway provides an electrical interface to the working portion.

Among other things, the working portion includes one or both MEMS structure and circuitry for at least in part detecting movement of the MEMS structure. In fact, in some embodiments, the cap and die form a chamber for sealingly containing (e.g., hermetically) the working portion of the die. Moreover, the conductive pathway may be capable of transmitting electrical signals relating to the operation of the MEMS structure. Exemplary working portions may include accelerometer or gyroscope structure.

The sensor further may include an electrical interconnect substrate having at least one circuit element. The die and cap together form a capped die that is coupled to the substrate so that the conductive path contacts the substrate to interconnect with the at least one circuit element. In yet other embodiments, the cap has a top surface, and the conductive pathway extends through the cap to the top surface. In such case, the conductive pathway is exposed on the top surface.

In accordance with another aspect of the invention, a method of producing a sensor forms a plurality of working portions on a first wafer, and a plurality of through-holes and cavities on a second wafer. The method secures the second wafer to the first wafer so that at least one of the cavities aligns to at least one of the working portions. The through holes also may be filled with conductive material to form a plurality of conductive paths. After the two wafers are secured together, the method may dice them to form individual sensors.

The method also may form a sensing component and amplification circuitry within each working portion. The amplification circuitry illustratively is located electrically between the conductive material and the sensing component for each working portion.

In illustrative embodiments, the conductive material includes electroless nickel. Moreover, the second wafer may be secured to the first wafer by using screen print seal glass. The plurality of working portions may be formed on a first wafer by forming one of accelerometer structure and gyroscope structure on the first wafer. In addition, the working portion may have both or one of MEMS structure and corresponding circuitry. The conductive material in at least one of the through holes illustratively is formed to contact at least one of the working portions.

In accordance with other aspects of the invention, a sensor has a die with a working portion, and a flip-chip bond pad electrically coupled with the working portion. Moreover, the working portion has movable structure and circuitry for detecting movement of the movable structure. Accordingly, the bond pad is coupled with the circuitry. The sensor also has an electrical interconnect substrate, where the die is flip-chip bonded to the substrate via the flip-hip bond pad.

The sensor also may have a cap at least partially covering the working portion, where the flip chip bond pad is secured to the cap. In some embodiments, the conductive pathway extends through the cap from the flip chip bond pad to the circuitry.

In accordance with another aspect of the invention, a sensor has a die with a working portion, and a cap coupled with the die to at least partially cover the working portion. In addition, the sensor also has a sensing component within the working portion, and amplification circuitry operatively coupled with the sensing component. A conductive pathway extends through the cap to the working portion to provide an electrical interface to the working portion. The amplification circuitry is positioned electrically between the sensing component and the conductive pathway.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

In illustrative embodiments, a sensor is capped at the wafer level—no package is necessary. Moreover, the sensor also has one or more conductive paths extending through the cap to permit electrical communication with components on the die. Details of illustrative embodiments are discussed below.

Figure 1:
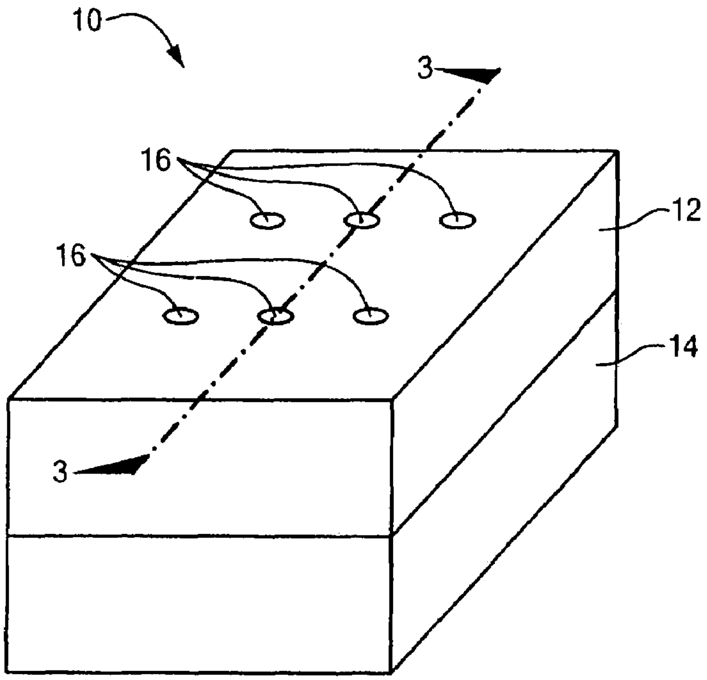
FIG. 1 schematically shows a sensor produced in accordance with illustrative embodiments of the invention.

FIG. 1 schematically shows a sensor 10 produced in accordance with illustrative embodiments of the invention. The sensor 10 includes a cap 12 for covering circuitry and/or structure (referred to below as the "working portion 30" of the sensor 10) on an underlying die 14. External contacts 16 on the top surface of the cap 12 provide an interface to conductive paths 18 (FIG. 3, discussed below) extending through the cap 12 to the circuitry and/or structure on the die 14. The external contacts 16 permit the sensor 10 to be flip-chip mounted to a larger electrical interconnect apparatus.

In illustrative embodiments, the sensor 10 is a two millimeter wide, flip-chip mountable MEMS device (i.e., a microelectromechanical system) implementing a function conventionally performed by MEMS devices. For example, among other things, the sensor 10 may implement the function of an inertial sensor (e.g., a gyroscope or accelerometer), which is discussed herein as an illustrative embodiment of the invention. It should be noted, however, that although illustrative embodiments are discussed as being a MEMS accelerometer or MEMS gyroscope, the discussed principles can apply to other types of devices. For example, such devices may have the functionality of an electrometer, RF switch, oscillator, surface acoustic wave filter, or a variable capacitor. Other functions conventionally known in the art also may be performed. Accordingly, discussion of an inertial sensor is exemplary and thus, not intended to limit all embodiments of the invention.

Figure 2:
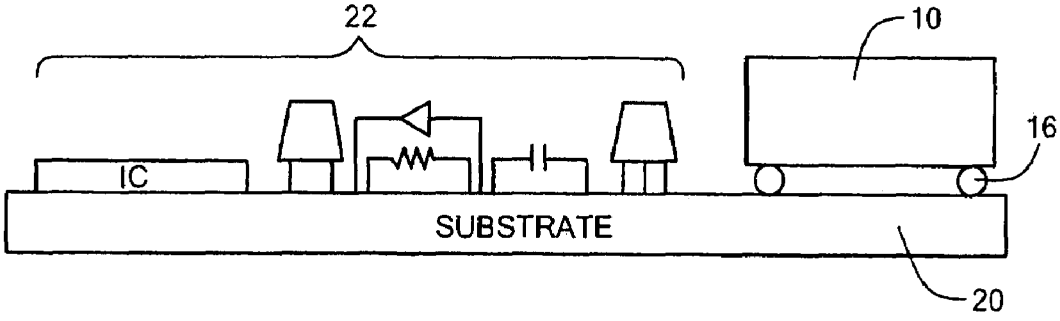
FIG. 2 schematically shows the sensor of FIG. 1 on a substrate with other electronic components.

The sensor 10 can be used as a part of a larger system. FIG. 2 schematically shows one exemplary use of the sensor 10 in a larger system. Specifically, FIG. 2 shows the sensor 10 flip-chip mounted on an interconnect substrate 20 having a plurality of additional circuit components 22. The other components 22 may include integrated circuits, MEMS devices, discrete circuit elements, or other conventional electronic components. Accordingly, the sensor 10 cooperates with the other electronic components 22 to produce a desired function. For example, if the sensor 10 is an accelerometer, the system may have circuitry that detects an acceleration signal from the sensor 10 and, consequently, deploys air bags in an automobile.

Those skilled in the art should understand that the substrate 20 may be any interconnect apparatus that mechanically supports and electrically connects two or more electronic components (e.g., the sensor 10 and an integrated circuit). For example, among other things, the interconnect substrate 20 may be a multilayer ceramic circuit board, flexible circuit, or a part of a larger integrated circuit. Embodiments of the sensor 10 having no circuitry thus may be mounted to an integrated circuit substrate that has the circuitry for detecting and/or actuating the sensor structure.

Figure 3:
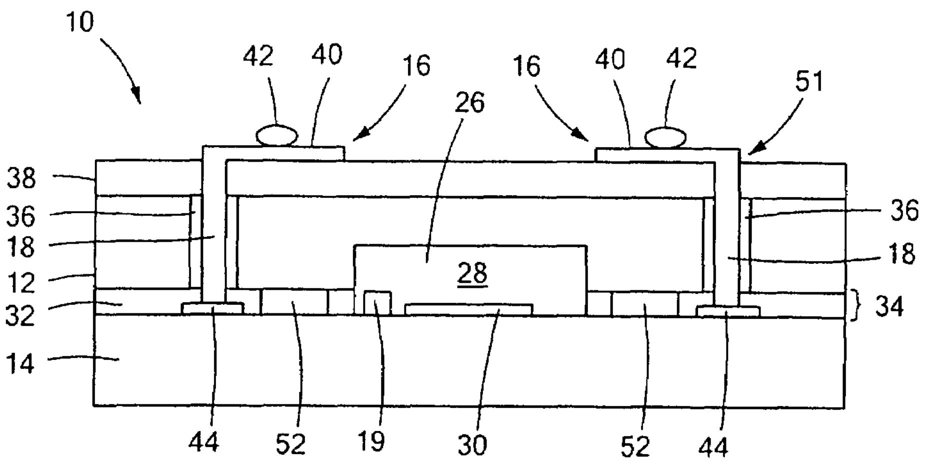
FIG. 3 schematically shows a cross-sectional view of the sensor shown in FIG. 1 across line 3-3.

FIG. 3 shows a cross-sectional view of the sensor 10 across line 3-3 of FIG. 1. This view shows more details of the sensor 10, its various layers, and its conductive paths 18. More particularly, the cap 12 has a cavity 26 that forms a internal chamber 28 when secured to the die 14. This internal chamber 28 contains at least part of the working portion 30 of the sensor 10; namely one or both of the structure and/or circuitry of the sensor 10. In illustrative embodiments, this internal chamber 28 forms a hermetic seal to fully protect the structure only. In that case, the circuitry, if any, is outside of the internal chamber 28—it is covered with a polymer 32 that seals the gap 34 between the cap 12 and the die 14. A gas may be injected into the internal chamber 28 to further protect the working portion 30.

As noted above, conductive paths 18 extend through the cap 12 from internal contacts 44 to their corresponding external contacts 16. A circumscribing insulator 36 (e.g., a dielectric) electrically isolates each conductive path 18 from the cap 12. An insulator layer 38 (e.g., a dielectric) also is formed over the cap 12 to support the external contacts 16. Specifically, the top of the conductive paths 18 couple with metal contacts 40 that extend through the insulator layer 38 to the outside surface of the sensor 10. Although not necessary, flip-chip contact balls 42 may be formed on the contacts to facilitate flip-chip bonding. Accordingly, each metal contact 40 and corresponding conductive path 18 may be considered to form a single conductive path between an internal contact 44 and an external device. Electrical signals thus may be transmitted between the working portion 30 and the external device via the conductive paths 18.

The internal contacts 44 form the internal port for electrically connecting with the working portion 30. Accordingly, if the working portion 30 includes circuitry, then circuit traces may connect the internal contacts 44 with the circuitry. Alternatively, the internal contacts 44 may directly secured to the circuitry. In illustrative embodiments, the contacts 44 are manufactured from aluminum. If the working portion 30 includes only structure, such as accelerometer structure, then the internal contacts 44 may be used to forward variable capacitance signals to an external device through the conductive paths 18.

Figure 4:
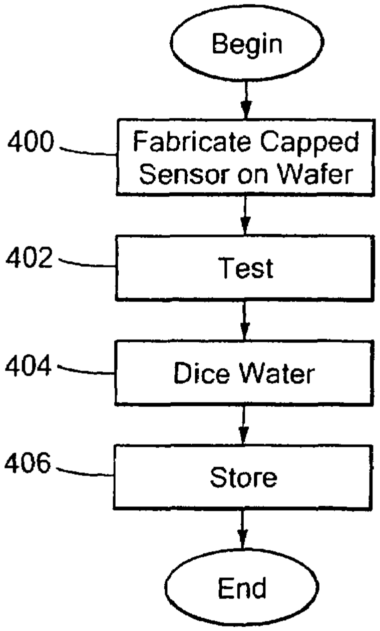
FIG. 4 shows an exemplary process of producing the sensor shown in FIG. 1.
Figure 5:
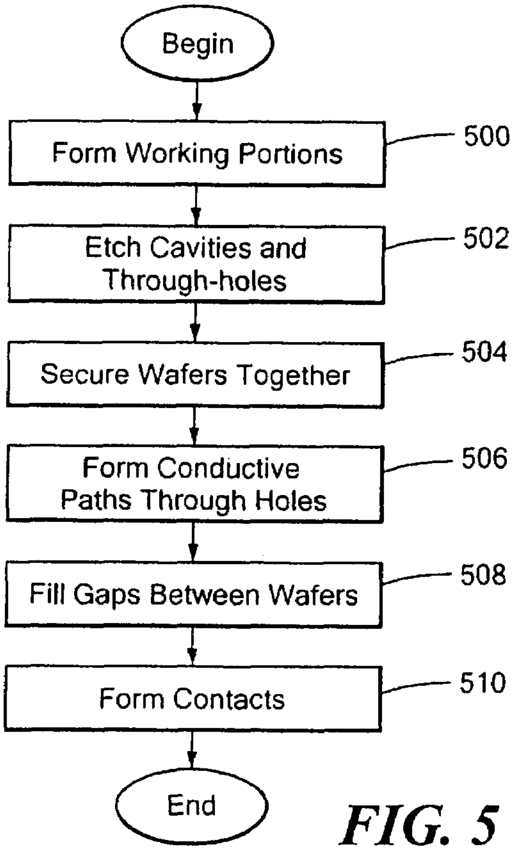
FIG. 5 shows an exemplary process of fabricating a plurality of capped sensors on a single wafer as required by step 400 of FIG. 4.
Figure 6:
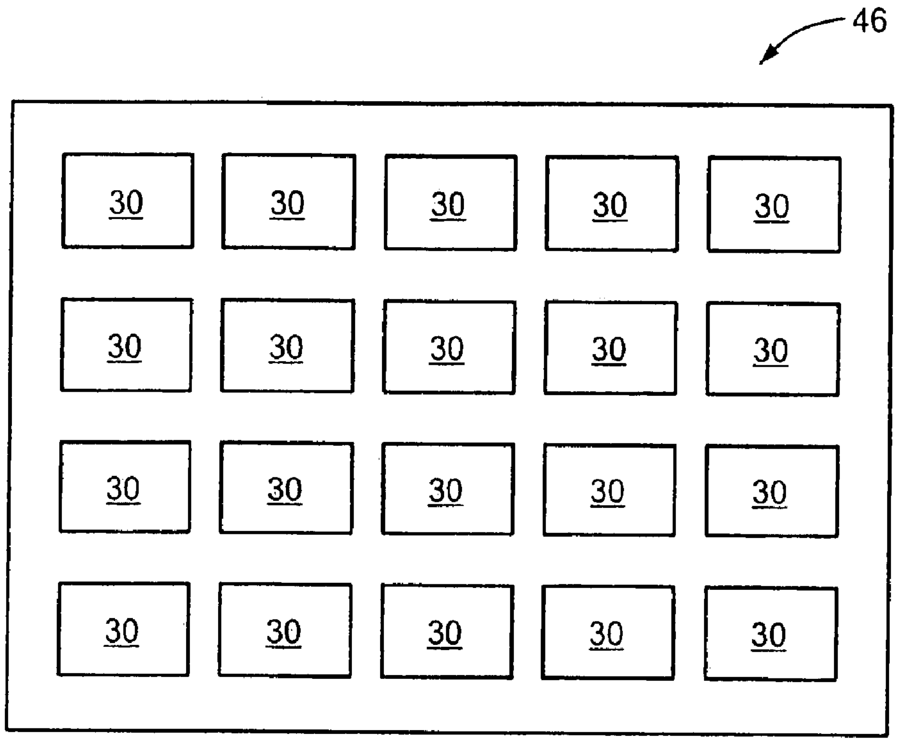
FIG. 6 schematically shows a plan view of a wafer having a plurality of working portions as discussed at step 500 of the process shown in FIG. 5.
Figure 7:
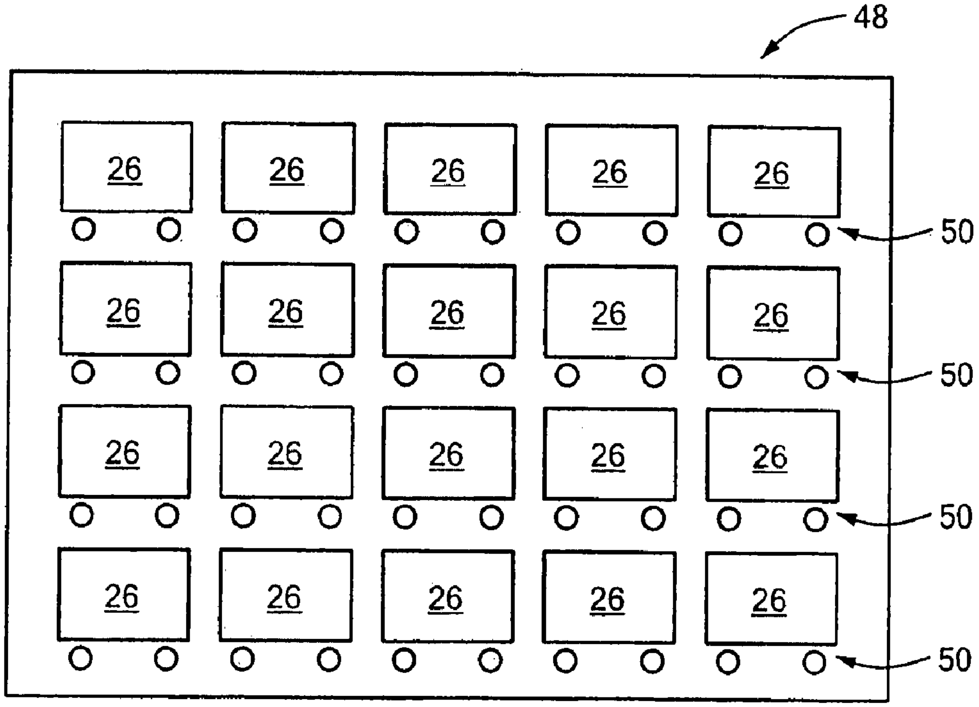
FIG. 7 schematically shows a plan view of a wafer having a plurality of cavities and through holes as discussed at step 502 of the process shown in FIG. 5.

FIG. 4 shows an exemplary process of producing the sensor 10 shown in FIG. 1. The process begins at step 400, in which a plurality of sensors 10 are fabricated on a base wafer 46 (FIG. 6, discussed below) and capped by a cap wafer 48 (FIG. 7, discussed below). Step 400 thus produces a relatively large two-dimensional array of undiced sensors 10. FIG. 5 shows one embodiment of this fabrication process and is discussed in greater detail below. The process then continues to step 402, in which the sensors 10 are tested in accordance with conventional processes to confirm that they operate properly for their intended purposes.

After the sensors 10 are tested, the coupled wafers are diced (step 404) to produce a plurality of independent sensors 10. The sensors 10 that did not pass the testing step 404 may be discarded. The remaining sensors 10 then are stored (step 406) in a conventional manner. In illustrative embodiments, the remaining sensors 10 are stored so that they may be used in a high-speed automated mounting process. For example, the remaining sensors 10 may be stored in a conventional tape-and-reel apparatus. Alternatively, the remaining sensors 10 may be stored in a tray, or other conventional manner.

FIG. 5 shows a process of fabricating the plurality of capped sensors 10 as discussed above at step 400. FIGS. 6, 7, 8A-8D illustrate this discussion by showing the wafers and a singe sensor 10 in various stages of development. It nevertheless should be noted that although a single sensor 10 is shown in some of those Figures (e.g., FIGS. 8A-8D), this process is substantially simultaneously performed for all capped sensors 10 on a single base wafer 46. It also should be noted that various steps of this process, as well as some steps of the process of FIG. 4, can be performed in a different order than that discussed.

The process of FIG. 5 begins at step 500, in which a plurality of working portions 30 are formed on the base wafer 46. FIG. 6 shows an exemplary base wafer 46 having an array of twenty (undiced) dies 14 with their respective working portions 30. Of course, the base wafer 46 may have different numbers of dies 14, such as up to between 2,500 and 5,000. Producing large quantities of dies 14 on a single base wafer 46 can significantly reduce the per die production cost. In illustrative embodiments, the base wafer 46 and the cap wafer 48 both are standard six inch silicon wafers.

As noted above, some embodiments of the working portions 30 have structure only. For example, the structure may be a micromachined accelerometer structure having a mass suspended above the die 14. The mass may have a plurality of fingers inter-digitated with a plurality of fixed fingers on the die 14. As a further example, the structure may be a micromachined gyroscope structure having an oscillating mass suspended above a die 14. In a manner similar to the accelerometer, such a mass also may have a plurality of fingers inter-digitated with a plurality of fixed fingers on the die 14. In either case, the working portion is considered to have a sensing component, which also is identified by reference number 30.

As also noted above, some embodiments of the working portions 30 have both structure and corresponding circuitry. In other words, the working portions 30 may integrate both structure and circuitry on a single die 14 (to be formed after the wafers are diced). In that case, the working portion 30 of an accelerometer also may have detection circuitry to detect a change in the capacitance between the inter-digitated fingers and, consequently, generate a signal of appropriate strength to an external component via the conductive paths 18.

Use of both structure and circuitry on a single die 14 (instead of structure only) is particularly advantageous in various embodiments of the disclosed sensor 10. Specifically, during testing, the conductive paths 18 produced some parasitic capacitance. Signals transmitted through the conductive paths 18 (e.g., signals representing the change in capacitance of the inter-digitated fingers) thus must be sufficiently strong enough to ensure that they do not become corrupted by the parasitic capacitance.

To that end, the on-chip circuitry may be preprogrammed to condition an output signal to a strength that can overcome the parasitic capacitance. The capacitive change produced by the inter-digitated signals of the noted accelerometer, for example, thus can be relatively small and still be appropriately processed by the on-board circuitry without being corrupted by the parasitic capacitance. Consequently, such structure may be smaller than similar sensors with structure only. Because structure typically requires much more space than circuitry, the overall size of the resulting sensor 10 can be minimized.

The working portions 30 on the base wafer 46 may be produced in accordance with conventional fabrication processes. For example, the base wafer 46 may be produced from single crystal silicon or polysilicon that is micromachined in accord with conventional processes. Processes discussed in the below listed U.S. patents may be used for producing the working portions 30. The disclosures of each of these patents, which are owned by Analog Devices, Inc. of Norwood, Mass., are incorporated herein, in their entireties, by reference.

U.S. Pat. No. 5,540,095, entitled, "MONOLITHIC ACCELEROMETER"

U.S. Pat. No. 5,620,931, entitled, "METHODS FOR FABRICATING MONOLITHINC DEVICE CONTAINING CIRCUITRY AND SUSPENDED MICROSTRUCTURE"

U.S. Pat. NO. 5,417,111, entitled, "MONOLITHIC CHIP CONTAINING INTEGRATED CIRCUITRY AND SUSPENDED MICROSTRUCTURE"

U.S. Pat. No. 5,314,572, entitled, "METHOD FOR FABRICATING MICROSTRUCTURES"

U.S. Pat. No. 5,345,824, entitled, "MONOLITHIC ACCELEROMETER"

U.S. Pat. No. 5,326,726, entitled, "METHOD FOR FABRICATING MONOLITHINC CHIP CONTAINING INTEGRATED CIRCUITRY AND SUSPENDED MICROSTRUCTURE"

After the working portions 30 are formed, the process continues to step 502, in which cavities 26 and through-holes 50 are etched through the cap wafer 48 shown in FIG. 7. It should be reiterated that FIGS. 6 and 7 are schematic and thus, not intended to show details of the respective wafers. Accordingly, the relative spacing of the through-holes 50 and their accompanying cavities 26 on FIG. 7 are not intended to show their special relationship. In illustrative embodiments, the cap wafer 48 is silicon doped with a p-type dopant.

Figure 8A:
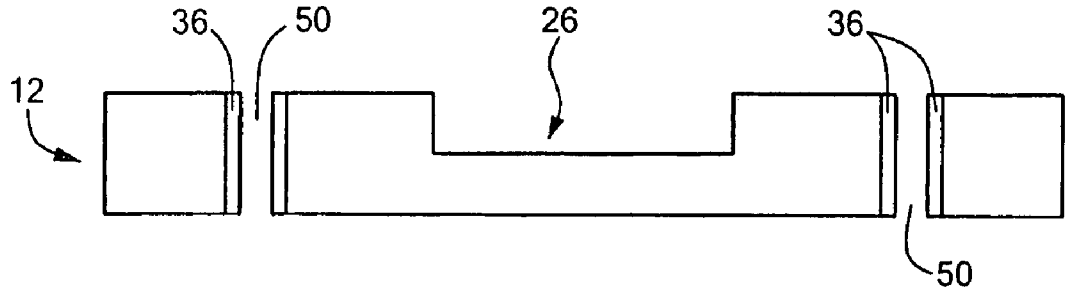
FIGS. 8A-8D schematically show cross-sectional views of the sensor shown in FIG. 1 at various stages of development discussed in FIG. 5.

As shown in cross-section in FIG. 8A, the through-holes 50 are formed completely through the cap wafer 48 wherever a conductive path 18 is to be deposited. After the through-holes 50 are formed, they may be lined with the prior noted dielectric insulator 36. In illustrative embodiments, the inner diameter formed by the insulator to receive the conductive path 18 is about fifty microns. It is more desirable, however, to have a wider inner diameter to form a thicker conductive path 18.

The cavity depth depends upon the structure being covered. For example, the cavity 26 may be about half the thickness of the cap 12. In that case, for a cap 12 having a thickness of 300 microns, the cavity 26 is about 150 microns deep. Shallower depths may suffice, however, to adequately cover the working portion 30.

Figure 8B:
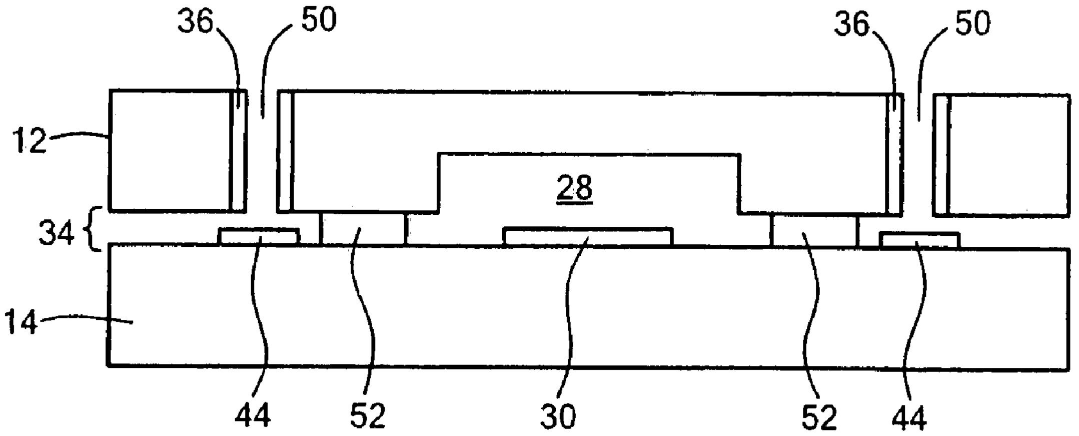
Figure 8C:
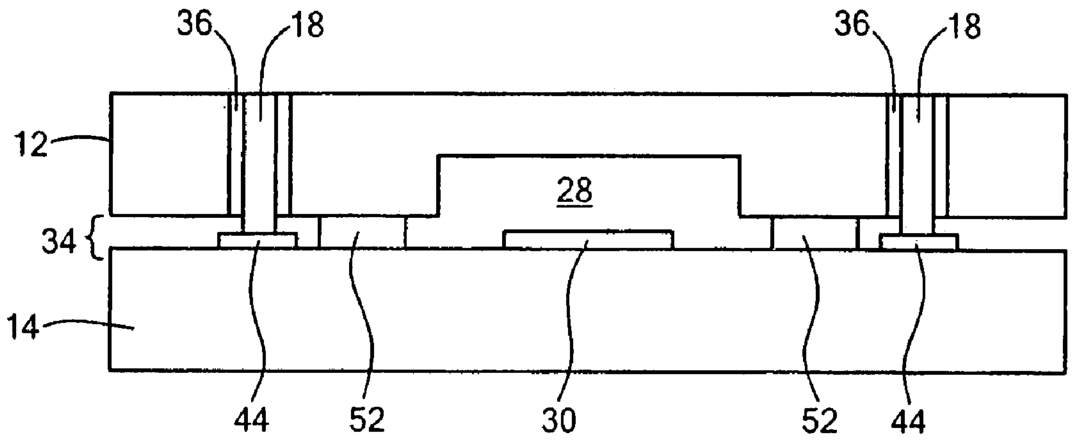

After the cavities 26 and through-holes 50 are formed, the base and cap wafers 48 are secured together (step 504) in a manner that seals the internal chamber 28 formed by the cavity 26. To those ends, as shown in FIG. 8B, a screen print seal glass 52 may be applied at various locations on the cap wafer 48. In illustrative embodiments, the screen print seal glass 52 produces a seal width of about 100 microns and a thickness of about 6 microns after bonded with the base wafer 46. Alignment keys (not shown) may be formed on the cap wafer 48 to facilitate screen printing. When used, the alignment keys may be formed on the cap wafer 48 when the sensor cavities 26 are etched (i.e., during step 502). Accordingly, as shown in FIG. 8B, the cavities 26 are aligned over at least part of the working portion 30.

The process then continues to step 506, in which the conductive paths 18 are formed within the through-holes 50. As noted above and shown in FIG. 8C, the conductive paths 18 are formed to extend through the cap 12 from the internal contacts 44 (i.e., from the working portions 30) to the top surface of the cap 12. Any conductive material suitable for the intended purpose may be used. For example, a doped polysilicon material may be used.

In illustrative embodiments, an electroless nickel (EN—commonly used in packaging processes) may be used to produce the conductive paths 18. Such a material is grown isotropically without an applied potential. Use of EN for this purpose is preferable, especially when used with aluminum internal contacts 44. Accordingly, when using EN, the through-hole 50 acts as a mold to confine the EN as it grows. When the EN grows to the top surface of the cap 12, the internal contacts 44 are removed from the EN solution to stop growth of the conductive paths 18. Alternatively, in some embodiments, the EN may be permitted to grow out of the top of the through-holes 50 to form a mushroom-shaped configuration. Such a configuration could facilitate flip-hip bonding.

Figure 8D:
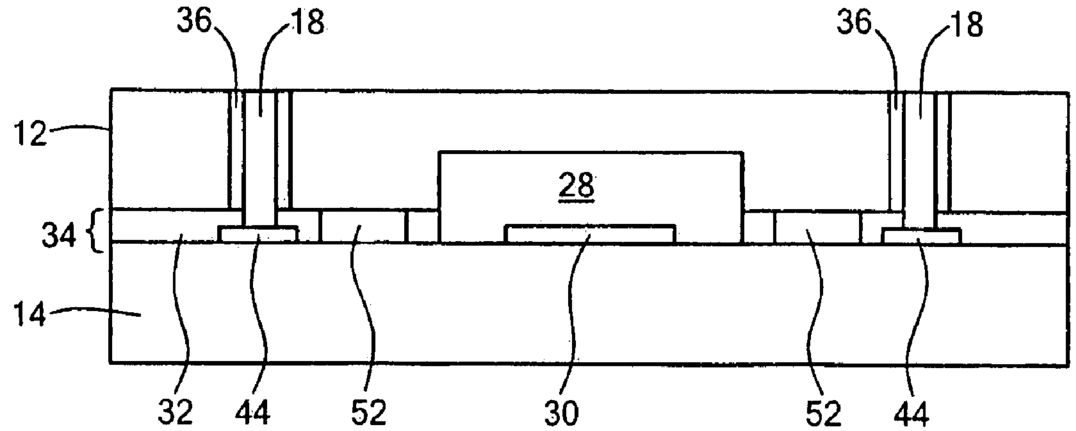

The remaining gap 34 between the base and cap wafers 48 then is filled with a material, such as a polymer 32 (step 508 and FIG. 8D). If the working portion 30 includes circuitry, then the polymer 32 substantially covers the circuitry. Among other benefits, filling the gap 34 in this manner provides further structural integrity to the sensors 10 and protects the circuitry from moisture induced failures. The polymer 32 may be applied by conventional processes, such as by a capillary force. Alternatively, the circuitry may be within the internal chamber 28 and thus, not be covered by the polymer 32. At this point in the process, the overall sensor 10, in its present state, can be thinned to meet application specific requirements. For example, standard foundry processes can thin both sides of the sensor 10 to about 600 microns.

The external contacts 16 then are formed at step 510 (see FIG. 3). To that end, the dielectric layer 38 is formed over the top of the cap wafer 48, and then etched with through-holes 51 that terminate at the top ends of the conductive paths 18. A metal then is deposited in the through-holes 51 of the dielectric layer 38 to make electrical contact with the electroless nickel conductive paths 18. This metal forms the contacts 40 for the sensors 10. Conventional ball contacts 42 may be applied to further facilitate flip-chip mountings.

As noted above, circuitry may condition an output signal (from the working portion 30) so that it overcomes parasitic capacitance issues. For example, some embodiments electrically position amplification circuitry 19 between the output of the sensing component 30 and the conductive paths 18. See, e.g., FIG. 3. More specifically, if the sensing component 30 has a movable mass that detects acceleration, then the amplification circuitry 19 receives the output signal produced by the moving mass. Among other things, such an output signal may be a voltage signal produced by a changing capacitance of interdigitated fingers. The amplification circuitry 19 amplifies the received voltage signal to a predetermined level for transmission through the conductive paths 18. This predetermined level should be selected to be sufficient to overcome the parasitic capacitance.

Figure 9:
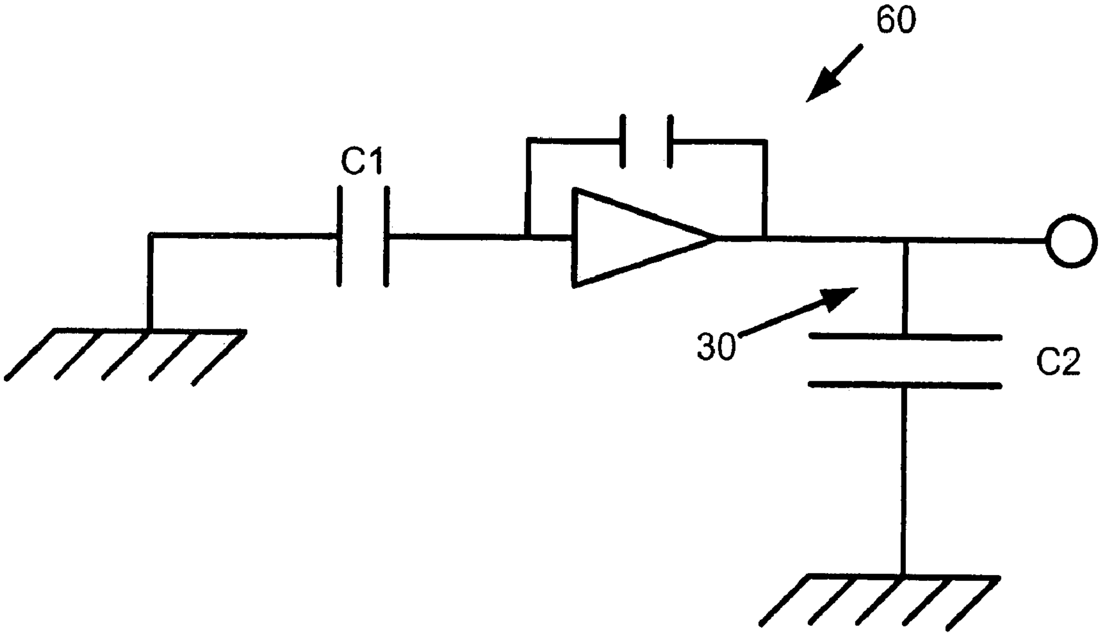
FIG. 9 schematically shows amplification circuitry that may be integrated into a sensor produced in accordance with illustrative embodiments of the invention.

FIG. 9 schematically shows one such an arrangement, where capacitance C1 represents the aggregate capacitance of the sensing component 30, and capacitance C2 represents the aggregate parasitic capacitance of the conductive paths 18. As shown, amplification circuitry 60 amplifies a signal received from the sensing component 30 (from capacitor C1), and forwards it toward the conductive paths 18 (i.e., toward the capacitance C2). The amplification circuitry 60 can be on the same die as a sensing component, or on a different die. Of course, additional circuitry, such as sensing or actuation circuitry, may be positioned between the amplification circuitry 60 and the capacitors C1 and C2.

The amplification circuitry 60 provides number of advantages. Among other things, it reduces the likelihood that the parasitic capacitance C2 will corrupt the output signal of the sensing component 30. Moreover, the amplification circuitry 60 enables the size of the sensing component 30 to be reduced, thus enabling a higher yield during fabrication and reducing overall device size.

Although various exemplary embodiments of the invention are disclosed above, it should be apparent to those skilled in the art that various changes and modifications can be made that will achieve some of the advantages of the invention without departing from the true scope of the invention.

What is claimed is:

1. A method of producing a sensor, the method comprising:

forming a plurality of working portions on a first wafer;

forming a plurality of through-holes and cavities on a second wafer;

securing the second wafer to the first wafer, at least one of the cavities aligning to at least one of the working portions;

filling the through holes with conductive material to form a plurality of conductive paths;

forming a sensing component and amplification circuitry within each working portion, the sensing component and the amplification circuitry being operatively coupled, the amplification circuitry being electrically positioned between the conductive material and the sensing component for each working portion; and dicing the first and second wafers.

2. The method as defined by claim 1 wherein the conductive material includes electroless nickel.

3. The method as defined by claim 1 wherein securing the second wafer to the first wafer includes using a screen print seal glass.

4. The method as defined by claim 1 wherein forming a sensing component includes forming one of accelerometer structure and gyroscope structure on the first wafer.

5. The method as defined by claim 1 wherein the conductive material in at least one of the through holes contacts at least one of the working portions.

6. The method as defined by claim 1 wherein forming a sensing component and amplification circuitry includes forming MEMS structure and corresponding circuitry.

7. The product produced by the process defined by claim 1.

* * * * *